United States Patent

Nakawaki et al.

[11] Patent Number: 5,978,060
[45] Date of Patent: Nov. 2, 1999

[54] LIQUID CRYSTAL DISPLAY APPARATUS AND APPARATUS FOR MANUFACTURING THE SAME

[75] Inventors: Toshiteru Nakawaki, Kadoma; Shinichi Tani; Masayoshi Takemoto, both of Yamatokoriyama, all of Japan

[73] Assignee: Sharp Kabushiki Kaisha, Osaka, Japan

[21] Appl. No.: 08/749,765

[22] Filed: Nov. 20, 1996

[30] Foreign Application Priority Data

Nov. 20, 1995 [JP] Japan .................................. P7-301057
Jun. 28, 1996 [JP] Japan .................................. P8-169095

[51] Int. Cl.$^6$ .................................................. G02F 1/1345
[52] U.S. Cl. .............................. 349/150; 349/58; 349/152
[58] Field of Search .................................... 349/149, 150, 349/151, 152, 58, 60; 345/206; 361/789, 749, 803; 439/67, 68, 74

[56] References Cited

U.S. PATENT DOCUMENTS 5,467,210  11/1995  Kishigami ................................. 349/151
5,805,249   9/1998  Hasegawa et al. ...................... 349/149

FOREIGN PATENT DOCUMENTS 5-80348   4/1993  Japan .
5333358  12/1993  Japan .
7248493   9/1995  Japan .

Primary Examiner—William L. Sikes
Assistant Examiner—Tai V. Duong

[57] ABSTRACT

An object of the invention is to solve the problem that a pitch of a connection terminal is limited and a circuit size is enlarged by itself in the case where a Com-PWB and a Seg-PWB provided along a side of the liquid crystal display panel are connected via the flexible flat cable. The Com-PWB is provided approximately in parallel along one side of the liquid crystal display panel on the voltage application terminal side of the scanning electrode while the Seg-PWB is provided approximately in parallel along the other side of the liquid crystal display panel on the voltage application terminal side of the data electrode. The Com-PWB has a length nearly equal to that of the one side of the liquid crystal display panel while the Seg-PWB has a length nearly equal to that of the other side of the liquid crystal display panel. The Com-PWB and the Seg-PWB are electrically connected with an FPC. The FPC has a bent part, and is arranged in the vicinity of the end part where the Com-PWB and the Seg-PWB are located in proximity to each other, and the bent part is arranged in proximity to the liquid crystal display panel. Such liquid crystal display panel, the Com-PWB, the Seg-PWB and the FPC are supported together by the upper bezel and the lower bezel.

8 Claims, 8 Drawing Sheets

1

LIQUID CRYSTAL DISPLAY APPARATUS AND APPARATUS FOR MANUFACTURING THE SAME

BACKGROUND OF THE INVENTION

1. Field of the Invention

The present invention relates to a liquid crystal display apparatus having a structure in which driving circuit substrates are electrically connected to each other by using a flexible electrode substrate therebetween and an apparatus for manufacturing such liquid crystal display apparatus.

2. Description of the Related Art

A structure of a conventional liquid crystal display apparatus will be explained hereinbelow referring to using a figure showing the display apparatus as seen from a side opposite to the display surface thereof.

FIG. 9 is a plane view showing a structure of the conventional liquid crystal display apparatus as seen from a side opposite to the display surface thereof. As shown in FIG. 9, the conventional liquid crystal display apparatus comprises a liquid crystal display panel 101 composed of two glass substrates having strip electrodes which are orthogonal to each other, pasted so that the strip electrodes of one of the glass substrates confront the strip electrodes of the other of the glass substrates and a certain gap is provided between the two glass substrates to be charged with a liquid crystal; a TAB film 102 mounting a driving IC for driving the liquid crystal display panel 101; a scanning side driving circuit substrate (hereinafter referred to as a "Com-PWB") 103 and a data side driving circuit substrate (hereinafter referred to as a "Seg-PWB") which are both electrically connected to the liquid crystal display panel 101 via the TAB film 102; an upper bezel 110 and a lower bezel (not shown) for supporting the above constituent parts together with each other; and a plastic chassis (not shown).

The liquid crystal display panel 101 has a rectangular flat plate-like configuration. The Seg-PWB 104 has a strip-like configuration and is arranged along a longitudinal direction which is one of the directions of the liquid crystal display panel 101. The Com-PWB 103 has a strip-like configuration and is arranged in a latitudinal direction which is another direction orthogonal to the one direction of the liquid crystal display panel 101. While the Seg-PWB 104 is arranged along the longitudinal direction of the liquid crystal display panel 101 on both sides thereof while the Com-PWB 103 is arranged along the latitudinal direction of the liquid crystal display panel 101 on one side thereof.

In the prior art, for electrical connection between the Com-PWB 103 and the Seg-PWB 104 is used a flexible flat cable (hereinafter referred to as an "FFC") 105, which is cheap in cost, and can be visually aligned with ease.

A structure of connecting the Com-PWB 103 and the Seg-PWB 104 is such that a connection terminal 131 of the Com-PWB 103 and a connection terminal 141 of the Seg-PWB 104 are arranged opposite to each other so that a lead wire of the FFC 105 becomes a straight line, aligning and manually soldering the connection terminals 131 and 141 with the terminal of the FFC 105. The connection terminals 131 and 141 are arranged to have a terminal pitch of 0.8 mm to 1.0 mm so that the connection terminals 131 and 141 can be soldered.

For this purpose, the longitudinal direction of the Seg-PWB 104 has a length equal to the sum total of the addition of the longitudinal direction length of the liquid crystal display panel 101 and the latitudinal direction length of the Com-PWB 103 which stands in parallel to the longitudinal direction of the liquid crystal display panel 101. The Seg-PWB 104 is arranged on both sides of the liquid crystal display panel 101 along the longitudinal direction thereof so as to sandwich the liquid crystal display panel 101 and the Com-PWB 103 therebetween. Then, in the lower bezel, the plastic chassis and the upper bezel 110 supporting the above constituent parts, an attachment holding part 106 for attaching the liquid crystal display apparatus on electronic apparatus such as a personal computer or the like is respectively provided in each corner part thereof. The attachment holding part 106 is provided so as to be located outside of the FFC 105. In FIG. 9, the attachment holding part 106 is provided outside of the Seg-PWB 104 in the longitudinal direction thereof.

Furthermore, Japanese Unexamined Patent Publication JP-A 7-248493 (1995) discloses a structure in which a notch is provided in the corner part of the Seg-PWB 103, and the attachment holding part 106 is positioned in the corner part thereof.

In recent years, there is a stronger demand for reducing the size of the liquid crystal display apparatus. So it is necessary to reduce the size of a part (hereinafter referred to as a window frame) other than the display area of the liquid crystal display apparatus. Thus, circuit components thereof have been gradually reduced in size. However, the conventional liquid crystal display apparatus has a disadvantage in that no attempt can be made to reduce the window frame thereof in size because of the following reasons.

Since the conventional electrical connection of the Com-PWB 103 and Seg-PWB 104 with the FFC 105 by soldering requires a terminal pitch of the FFC 105 of about 0.8 mm to 1.1 mm, a space where the connection terminals 131 and 141 are formed cannot be reduced in size, and the width (the latitudinal direction length) of the Com-PWB 103 and the longitudinal direction length of the Seg-PWB 104 can not be reduced. The prior art liquid crystal display apparatus requires a width of the Com-PWB 103 of about 20 mm to 30 mm in a 10.4 type panel.

Furthermore, in the case where the attachment holding parts 106 are provided on the upper and the lower bezel which support the liquid crystal display panel 101 so as to be located outside of the FFC 105 as shown in FIG. 9, the width of the window frame of the side having the Com-PWB 103 provided thereon, namely a width from the end of the display area on the side of the Com-PWB 103 to the end of the upper or the lower bezel on the side of the Com-PWB 103 will be about 30 mm to 40 mm in the 10.4 type panel.

Even in the structure disclosed in JP-A 7-248493, the width of the Com-PWB 103 cannot be reduced to a sufficiently small level, so that the width of the window frame will be about 25 mm to 35 mm.

Furthermore, in the case where an attempt is made to electrically connect the Com-PWB 103 to the Seg-PWB 104 by using the FFC 105 in the similar manner to that of the prior art, a deviation from the design value which is generated at the time of aligning the Com-PWB 103 and the Seg-PWB 104 cannot be solved.

Furthermore, the soldered connection seen in the prior art has a problem in reliability because of the following reasons; it is difficult to connect narrow pitches by soldering, it is difficult to control the soldering time and the temperature of the tip of the soldering iron which is used for the soldered connection, the completed state of the soldered connection depends on the skill of the worker.

To solve the problem described above, Japanese Unexamined Patent Publication JP-A 5-333358 (1993) discloses a structure in which the Com-PWB 103 and the Seg-PWB 104 are connected to the connection substrate via an anisotropic conductive film and further the connection substrate is connected to a liquid crystal panel via the anisotropic conductive film. JP-A 5-333358 also discloses a technique in which the Com-PWB 103 and Seg-PWB 104 are electrically connected via this connection substrate and the liquid crystal panel.

However, even in the technique disclosed in JP-A 5-333358 described above, there arises a problem in that since each kind of circuit components including large parts such as an aluminum electrolyte capacitors, DC/DC converters or the like are mounted on the Com-PWB 103, these components hinder crimping and connecting the Com-PWB 103 to the connection substrate by the anisotropic conductive film with reliability at the time when the Com-PWB 103 and the connection substrate are connected with an anisotropic conductive film.

On the other hand, it is thought that the Com-PWB 103 and the connection substrate are crimped and connected with the anisotropic conductive film before mounting the circuit components. However, after mounting the circuit components, sit is necessary to perform a reflow process in which the Com-PWB 103 is heated to about 250° C. Thus, there arises a problem in that the reliability in the connection of the anisotropic conductive film is deteriorated.

Furthermore, there is also a problem in that it is very difficult to align the circuit substrate to the liquid crystal panel circuit substrate within the scope of 90 to 100 μm as described in JP-A 5-333358, and the possibility will become high that a pattern deviation is generated.

SUMMARY OF THE INVENTION

The invention has been made to solve the problems described above, and an object of the invention is to provide a liquid crystal display apparatus wherein an attempt can be made to reduce the size of the external configuration of the liquid crystal display apparatus itself by reducing an area of a window frame which is a part other than the display surface of the liquid crystal display apparatus and an apparatus for manufacturing such a liquid crystal display apparatus.

The invention provides a liquid crystal display apparatus comprising:

a liquid crystal display panel;

a Com-PWB provided along a side of the liquid crystal display panel on a voltage application terminal side of a scanning electrode;

a Seg-PWB provided along a side of the liquid crystal display panel on a voltage application terminal side of a data electrode; and an upper and a lower bezel for supporting said constituent parts, wherein the Com-PWB is electrically connected to the Seg-PWB via a flexible electrode substrate which is arranged so that part of the flexible electrode substrate overlaps a corner part of the liquid crystal display panel.

Further the invention provides a liquid crystal display apparatus comprising:

a liquid crystal display panel including a scanning electrode and a data electrode which are insulated from each other;

a Com-PWB having a length nearly equal to the length of one end of the liquid crystal display panel on a voltage application terminal side of the scanning electrode, and arranged approximately in parallel with the one end;

a Seg-PWB having a length nearly equal to the length of another end of the liquid crystal display panel on a voltage application terminal side of the data electrode and arranged approximately in parallel with another end of the liquid crystal panel;

a flexible electrode substrate electrically connecting the Com-PWB to the Seg-PWB, having a bent part which is located in the vicinity of the liquid crystal display panel and arranged in the vicinity of the end parts of the Com-PWB and the Seg-PWB which are close to each other; and an upper and a lower bezel supporting together the liquid crystal display panel, the Corn-PWB, the Seg-PWB and the flexible electrode substrate.

The liquid crystal display apparatus of the invention is characterized in that the Com-PWB and the flexible electrode substrate are electrically connected to each other via a connector.

The liquid crystal display apparatus of the invention is characterized in that a reinforcing member is provided on a side opposite to the connector of the flexible electrode substrate.

The liquid crystal display apparatus of the invention is characterized in that the Seg-PWB and the flexible electrode substrate are electrically connected to each other by using an anisotropic conductive film.

The liquid crystal display apparatus of the invention is characterized in that the connection terminals of the Seg-PWB and the connection terminals of the flexible electrode substrate are formed in a plurality of rows.

The liquid crystal display apparatus of the invention is characterized in that the connection terminals of the Seg-PWB and the connection terminals of the flexible electrode substrate are formed in a single row.

The liquid crystal display apparatus of the invention is characterized in that an attachment holding part for attaching the liquid crystal display apparatus is formed on each of the upper and the lower bezel in the vicinity of a position where the Com-PWB and the Seg-PWB are located in proximity to each other.

The invention provides an apparatus for manufacturing a liquid crystal display apparatus, in which two circuit substrates having a plurality of rows of connection terminals formed thereon are arranged so that the connection terminals are located opposite to each other via an anisotropic conductive film, and are electrically connected to each other by heating and pressurizing the connection terminals by using connecting means, the apparatus comprising:

an end part of the connecting means, divided into a plurality of rows corresponding to the connection terminals which are formed in the plurality of rows.

In the liquid crystal display apparatus of the invention, the connection terminals can be reduced in size by electrically connecting the Com-PWB and the Seg-PWB with the flexible electrode substrate. In addition, by arranging the flexible electrode substrate so that a part thereof overlaps a corner portion of the liquid crystal display panel, the attachment holding part provided in the upper and the lower bezel can be formed in the vicinity of an intersecting part of extensions of the Com-PWB and the Seg-PWB.

Furthermore, in the liquid crystal display apparatus of the invention, the connection terminals can be reduced in size by electrically connecting the Com-PWB and the Seg-PWB with the flexible electrode substrate. In addition, the liquid crystal display apparatus can be reduced in size by arranging the flexible electrode substrate in the vicinity of the end part of the apparatus where a bent part is formed, and the Com-PWB and the Seg-PWB are located in proximity to each other, and arranging the bent part in the vicinity of the liquid crystal display panel to reduce the area of the window frame which is a part other than the display surface of the liquid crystal display apparatus.

At this time, the Com-PWB and the flexible electrode substrate can be electrically connected easily by using a connector.

In addition, the deterioration of the connection part as a result of the repeated attaching and detaching operation of the connector can be prevented with the provision of the reinforcing member on the side opposite to the connector of the flexible electrode substrate.

In addition, the Seg-PWB and the flexible electrode substrate can be electrically connected easily by using the anisotropic conductive film.

Furthermore, the pitch of the connection terminal can be set to a large value by forming a plurality of rows of the connection terminals of the Seg-PWB and the flexible electrode substrate.

Furthermore, in the case where least required pitch of the connection terminal can be secured by forming a single row of the connection terminal of the Seg-PWB and the connection terminal of the flexible electrode substrate, the Seg-PWB and the flexible electrode can be connected with reliability.

Furthermore, the attachment holding part for attaching the liquid crystal display apparatus can be formed in the upper and the lower bezel in the vicinity of a position where the Com-PWB and the Seg-PWB are located in proximity to each other with the result that the liquid crystal display apparatus can be reduced in size.

In the apparatus for manufacturing the liquid crystal display apparatus of the invention, since the end part of the connecting means is divided in a plurality of rows corresponding to the connection terminals which are formed in the plurality of rows in the case where the connection terminals of the Seg-PWB and the connection terminals of the flexible electrode substrate are formed in a plurality of rows, each of the connection terminals in the plurality of rows can be connected at the same time by using a single connecting means, and the reliability in the connection can be improved without increasing the number of steps.

As described above, in the liquid crystal display apparatus of the invention, the connection terminals of the Com-PWB and the Seg-PWB can be reduced by using the flexible electrode substrates in place of conventionally used flexible flat cable as the Com-PWB and the Seg-PWB provided along the sides of the liquid crystal display panel on the voltage application terminal sides and arranging the Com-PWB and the Seg-PWB so that parts of the flexible electrode substrates overlap the corner portion of the liquid crystal display panel. Since the attachment holding part formed in the tupper and the lower bezel can be formed in the vicinity of the intersecting part of the extension of the Com-PWB and the Seg-PWB, the size of the Com-PWB and the Seg-PWB can be reduced, and at the same time, an attempt can be made to reduce the size of the window frame of the liquid crystal display apparatus.

Furthermore, in the liquid crystal display apparatus of the invention, the connection terminal can be reduced in size by electrically connecting the Com-PWB and the Seg-PWB with the flexible electrode substrate. Then the liquid crystal display apparatus can be reduced in size by arranging the flexible electrode substrate in the vicinity of the end part of the apparatus where a bent part is formed and the Com-PWB and the Seg-PWB are located in proximity to each other, and arranging the bent part in the vicinity of the liquid crystal display panel to reduce an area of the window frame which is a part other than the display surface of the liquid crystal display apparatus.

The Com-PWB and the flexible electrode substrate can be electrically connected easily by using a connector. At this time, the terminal pitch can be set to about 0.4 mm to 0.5 mm.

Furthermore, the deterioration of the connection part as a result of the repeated attaching and detaching operation of the flexible electrode substrate by means of the connector can be prevented by the provision of the reinforcing member of the on the side opposite to the connector of the flexible electrode substrate.

The Seg-PWB and the flexible electrode substrate are electrically connected to each other easily by using an anisotropic conductive film. At this time, the terminal pitch can be set to about 0.4 mm to 0.5 mm.

Even when a deviation is generated from the design value at the time of aligning the liquid crystal display panel to the Com-PWB and the Seg-PWB, the deviation can be solved by using the flexible electrode substrate for electrically connecting the Com-PWB and the Seg-PWB in this manner. Additionally, since the two substrates are not soldered, a preliminary solder film thickness control and a flax condition control will not be required with the result that the cost of the flexible electrode substrate and the driving circuit substrate will be able to be reduced.

In the case where the anisotropic conductive film is used for electrically connecting the Seg-PWB and the flexible electrode substrate, the terminal pitch can be set to a large value by forming a plurality of rows of the connection terminals of the Seg-PWB and the connection terminals of the flexible electrode substrate. Consequently, in the case where the connection of the driving circuit substrate and the flexible electrode substrate are connected in a narrow area, the generation of the pattern deviation can be inhibited.

Furthermore, the connection terminal of the Seg-PWB and the connection terminal of the flexible electrode substrate can be connected with reliability in the case where least required pitch of the connection terminal can be secured by forming a single row of the connection terminal of the Seg-PWB and the connection terminal of the flexible electrode substrate.

Furthermore, the attachment holding part for attaching the liquid crystal display apparatus can be formed in the upper and the lower bezel in the vicinity of a position where the Com-PWB and the Seg-PWB are located in proximity to each other with the result that the liquid crystal display apparatus can be reduced in size.

In the apparatus for manufacturing the liquid crystal display apparatus of the invention, since the end part of the connecting means for heat crimping each of the connection terminals in the plurality of rows is divided to a plurality of rows corresponding to a plurality of connection terminal rows, each of the connection terminals in the plurality of rows can be heat crimped at the same time by evading projections such as a resist and through-holes which are formed between terminal rows which are formed in plurality.

Consequently, the reliability in the connection can be improved without increasing the number of steps.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
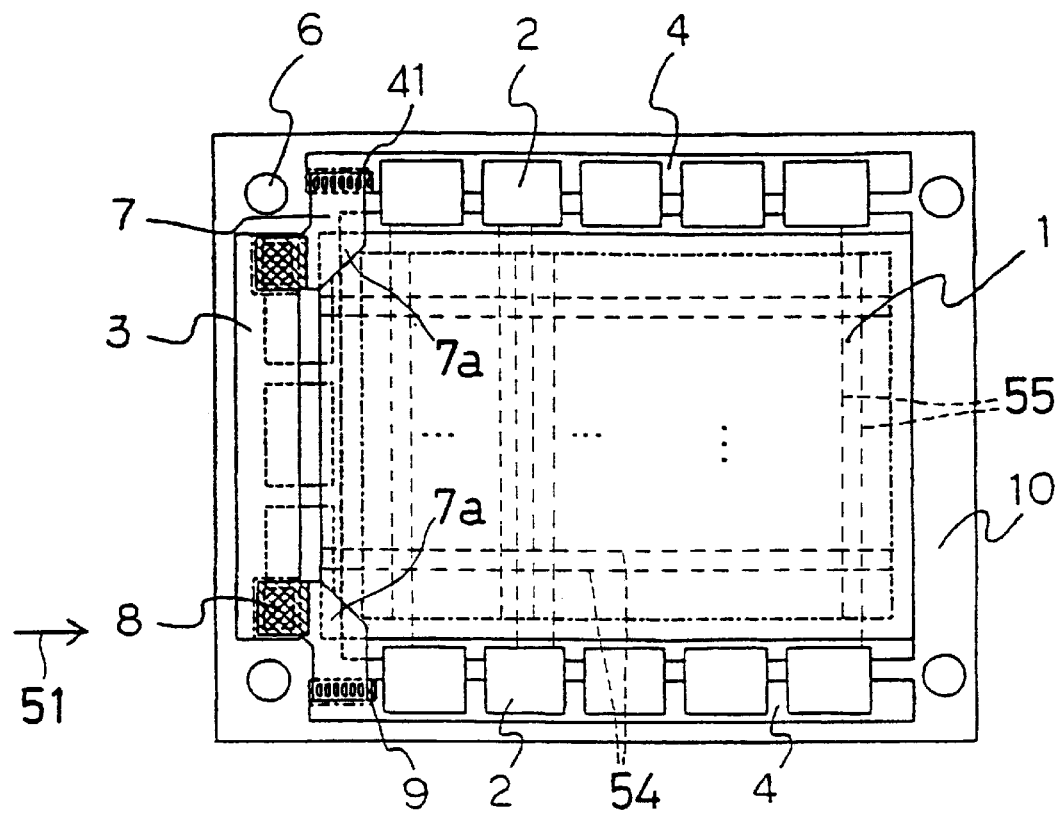
FIG. 1 is a plane of a liquid crystal display apparatus of a first embodiment of the invention as seen from a side opposite to a display surface of the apparatus.

Now referring to the drawings, preferred embodiments of the invention are described below.
(First Embodiment)

A first embodiment of the present invention will be explained below referring to FIGS. 1 through 4.

Figure 2:
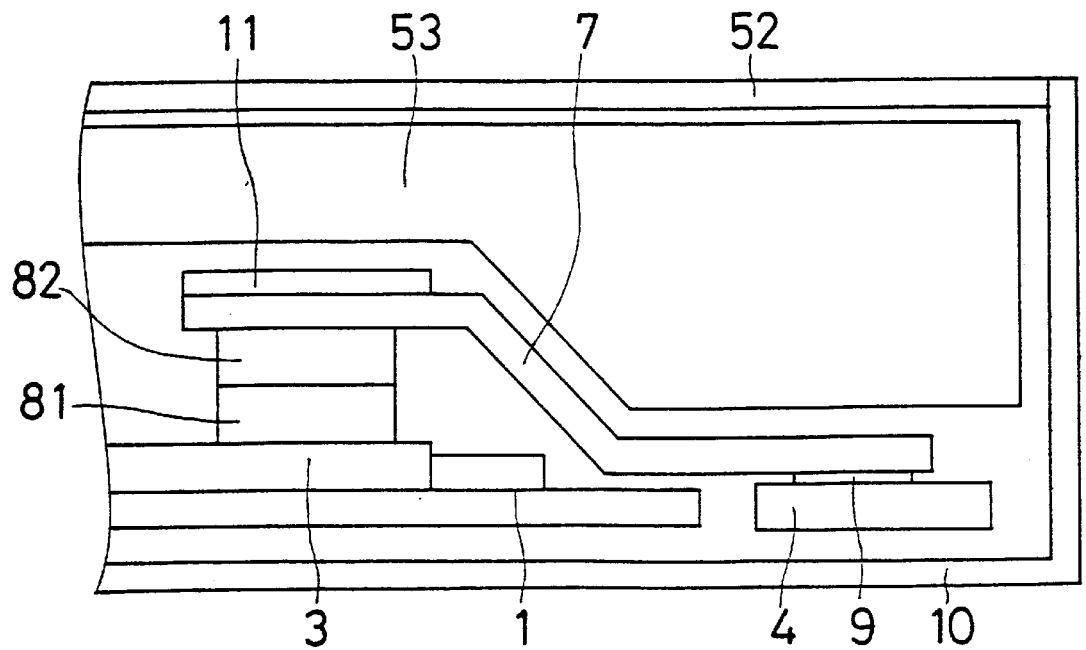
FIG. 2 is a side view of the liquid crystal display apparatus of the first embodiment of the invention as seen from the direction of an arrow 51.
Figure 3:
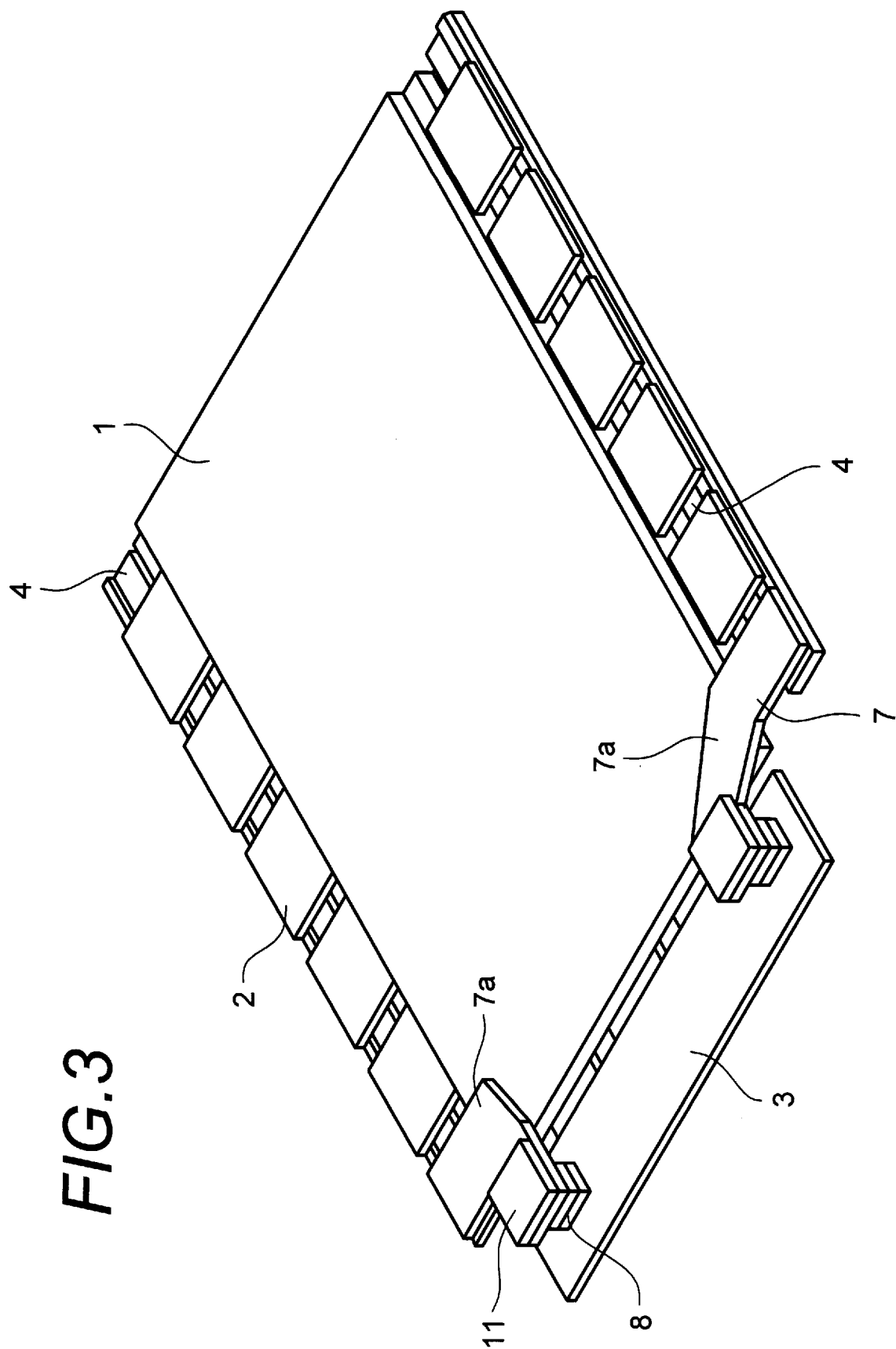
FIG. 3 is a perspective view showing a state in which a liquid crystal display panel 1, a Com-PWB 3 and a Seg-PWB 4 are electrically connected to each other.

FIG. 1 is a plane view showing a structure of a liquid crystal display apparatus of the invention as seen from a side opposite to the display surface thereof. FIG. 2 is a side view of the liquid crystal display apparatus of FIG. 1 as seen from a direction of an arrow 51. Furthermore, FIG. 3 is a perspective view excluding an upper bezel 10 in FIG. 1.

The liquid crystal display apparatus in the first embodiment has a liquid crystal display panel 1 composed of two glass substrates having strip electrodes which are orthogonal to each other, pasted so that the electrodes of one of the glass substrates confront the strip electrodes of the other of the glass substrates and a certain gap is provided between the two glass substrates to be charged with a liquid crystal, a TAB film 2 mounting a driving IC for driving this liquid crystal display panel 1, the Com-PWB 3 and the Seg-PWB 4 which are electrically connected to the liquid crystal display panel 1 via this TAB film 2, and a lower bezel 52, a plastic chassis 53 and an upper bezel 10 supporting together the constituent parts described above.

The liquid crystal display panel 1 has a rectangular flat plate-like configuration. The strip electrode formed on one glass substrate is used as a scanning electrode 54 while the strip electrode formed on the other glass substrate is used as a data electrode 55. The scanning electrode 54 and the data electrode 55 maintain the definite gap and insulation characteristics as described above. The Seg-PWB 4 has a strip-like configuration and is arranged approximately in parallel along a longitudinal direction which is one direction of the liquid crystal display panel 1. The Com-PWB 3 has a strip-like configuration and is arranged approximately in parallel along a longitudinal direction which is another direction orthogonal to one direction of the liquid crystal display panel 1. The Seg-PWB 4 is arranged on both sides of the liquid crystal display panel 1 along the longitudinal direction while the Com-PWB 3 is arranged on one side along the latitudinal direction of the liquid crystal display panel 1.

The Com-PWB 3 has a length nearly equal to that of the liquid crystal display panel 1 in the latitudinal direction while the Seg-PWB 4 has a length nearly equal to that of the liquid crystal display panel 1 in the longitudinal direction.

The Com-PWB 3 and the Seg-PWB 4 are electrically connected to each other via the flexible electrode substrate 7 (hereinafter referred to as "FPC"). The FPC 7 has a bent part 7a and is arranged in the vicinity of an end part where the Seg-PWB 4 and the Com-PWB 3 are located in proximity to each other. The bent part 7a is arranged in the vicinity of the liquid crystal display panel 1. Specifically, the Com-PWB 3 and the FPC 7 are electrically connected by using a connector 8 while the Seg-PWB 4 and the FPC 7 are electrically connected by using the anisotropic conductive film 9.

Furthermore, an attachment holding part 6 used at the time of setting the liquid crystal display apparatus in electronic apparatus such as a personal computer or the like is provided in the lower bezel 52, the plastic chassis 53 and the upper bezel 10 in the vicinity of a position where the Seg-PWB 4 and the Com-PWB 3 are located in proximity to each other. Specifically, the attachment holding part 6 is provided in the vicinity of the intersecting part of the extension of the Com-PWB 3 and the Seg-PWB 4. The FPC 7 is arranged so that part of the FPC 7 overlaps the corner part of the liquid crystal display panel 1 so as to be separated from the attachment holding part 6 toward the side of the liquid crystal display panel 1.

Here, the reason why the connector is used in place of the anisotropic conductive film for electrically connecting the Com-PWB 3 and the FPC 7 is that the Com-PWB 3 mounts on an approximately entire surface thereof each kind of circuit components including large parts such as the aluminum electrolyte capacitor, and a DC/DC converter or the like so that such circuit components prevent a secure crimping and connecting of the Com-PWB 3 and the FPC 7.

On the other hand, it is thought that the Com-PWB 3 and the FPC 7 are crimped and connected by using an anisotropic conductive film before the circuit components are mounted. However, a reflow process must be carried out to heat the Com-PWB 3 to about 250° C. after mounting the circuit components with the result that the reliability in the connection of the anisotropic conductive film is lowered. Consequently, it is desirable to use the connector to electrically connect the Com-PWB 3 to the FPC 7.

Furthermore, the reason why the anisotropic conductive film is used in place of the connector to electrically connect the Seg-PWB 4 and the FPC 7 is that the Seg-PWB 4 mounts only part of circuit components such as ceramic capacitors or the like so that the Seg-PWB 4 and the FPC 7 can be crimped and connected with reliability.

Furthermore, since the Seg-PWB 4 is often formed along two opposite sides of the liquid crystal display panel 1 in the case of a highly fine panel, it is desirable that the Seg-PWB 4 is formed in a fine size as much as possible. It is desirable to use the anisotropic conductive film to electrically connect the Seg-PWB 4 and the FPC 7 because no space can be provided for mounting the connector. Furthermore, when the connector is mounted, it is feared that the connector might contact the light source located below the connector to break the light source.

Thus, even when a deviation is generated from the design value at the time of aligning and connecting the Com-PWB 3 and the Seg-PWB 4 to the TAB film 2 connected to the liquid crystal display panel 1, the deviation can be solved because the FPC 7 is bent which is used for connecting the Com-PWB 3 and the Seg-PWB 4.

By the way, the FPC 7 and the Seg-PWB 4 are electrically connected by using the anisotropic conductive film 9 in the first embodiment, the FPC 7 cannot be aligned to the Seg-PWB 4 under a transmitting type microscope unlike the alignment of the liquid crystal display panel 1 to the TAB film 2 because the Seg-PWB 4 is opaque. Thus, the FPC 7 is aligned to the Seg-PWB 4 by using either a reflection-type microscope or an alignment jig. In the first embodiment, the FPC 7 and the Seg-PWB 4 are aligned by using the alignment jig. The alignment method will be explained referring to FIGS. 4A through 4D.

Figure 4A:
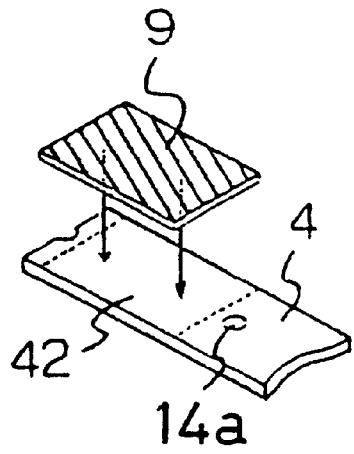
FIGS. 4A through 4D are views showing stepwise a process of connecting the Seg-PWB 4 and a flexible electrode substrate 7.
Figure 4B:
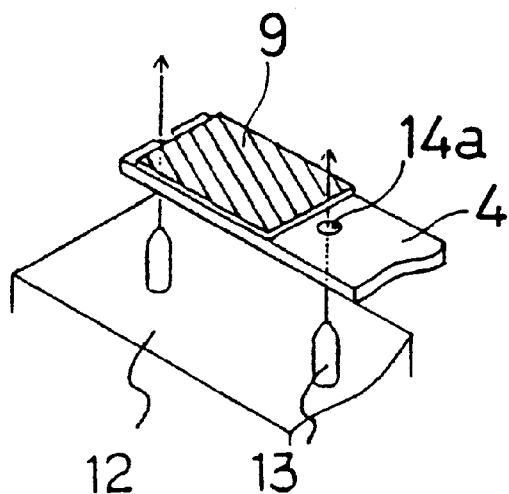
Figure 4C:
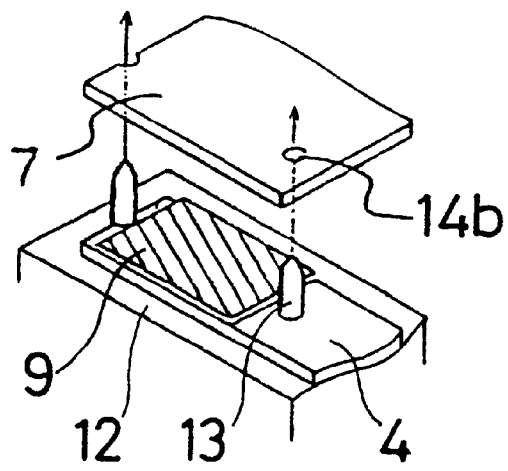
Figure 4D:
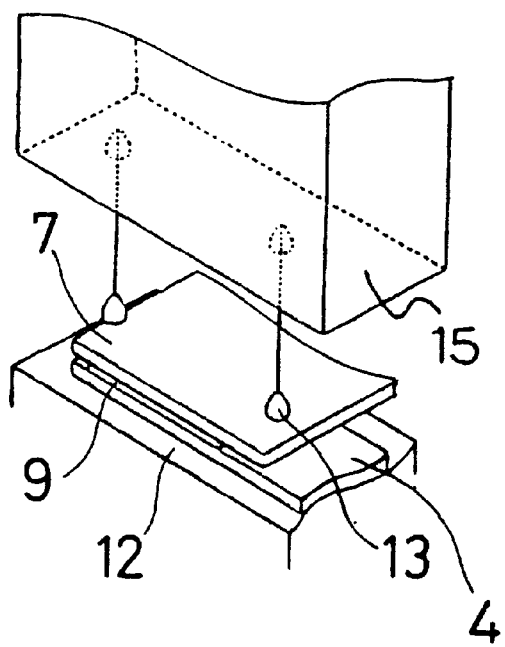

In the beginning, as shown in FIG. 4A, the anisotropic conductive film 9 is laminated onto the connection terminal 42 of the Seg-PWB 4. Next, as shown in FIG. 4B, the Seg-PWB 4 having an alignment hole 14a or a notch formed therein is fit onto an alignment pin 13 formed on the jig 12. Subsequently, as shown in FIG. 4C, the FPC 7 having an alignment hole 14b or a notch formed therein is fit onto the alignment pin 13 of the alignment jig 12 so that the Seg-PWB 4 and the FPC 7 are temporarily fixed with the anisotropic conductive film 9. Lastly, as shown in FIG. 4D, the Seg-PWB 4 and the FPC 7 are crimped and connected by using a crimping tool 15 with the Seg-PWB 4 and the FPC 7 fit onto the alignment pin 13. Incidentally, since it is necessary to add heat at the time of the crimping connection, the constant heat method was used in the first embodiment. By the way, the invention is not limited to the constant heat method, and the pulse heat method may be used. Thus, it is possible to prevent the deterioration of work efficiency by aligning the FPC 7 and the Seg-PWB 4.

In the first embodiment, the liquid crystal display apparatus is formed so that the diameter of the alignment holes 14a and 14b is set to 0.4 mm. When the diameter of the alignment holes 14a and 14b is smaller than 0.2 mm, the work efficiency will be deteriorated, and the alignment pin 13 formed in this manner along with the alignment holes 14a and 14b is liable to be broken. On the other hand, when the diameter of the alignment holes 14a and 14b is larger than 1.0 mm, a space is occupied more than needed. Consequently, it is desirable that the diameter of the alignment holes 14a and 14b is not less than 0.2 mm and not more than 1.0 mm.

The liquid crystal display apparatus which is constituted as described above can be manufactured in the following manner.

In the beginning, the TAB film 2 mounting a driving IC is connected to the voltage application terminals of the electrodes of the liquid crystal display panel 1 composed of two glass substrates arranged to have a gap therebetween which is charged with a liquid crystal. The liquid crystal display panel 1 is aligned to the TAB film 2 by setting to each other alignment marks described on the liquid crystal display panel 1 and the TAB film 2 in advance under the transmitting type microscope.

On the other hand, the Com-PWB 3 and the Seg-PWB 4 mount circuit components and are connected to each other.

Then, one side connection terminal 81 of a male and female type connector 8 is soldered and connected to the connection terminal of the Com-PWB 3.

Subsequently, the other side connection terminal 82 of the male and female type connector 8 is soldered and connected to the Com-PWB 3 connection terminal of the FPC 7. By the way, on a side of the FPC 7 opposite to the side where the male and female type connector 8, a reinforcing plate 11 may be formed which comprises plastic or the like to prevent failures that might be caused by the insertion and detachment of the other side connection terminal 82.

Then, the connection terminal 41 of the Seg-PWB 4 and the Seg-PWB 4 connection terminal of the FPC 7 are aligned by using the alignment jig 12 and crimped and connected via the anisotropic conductive film 9.

Next, the TAB film 2 connected to the liquid crystal display panel 1, the Com-PWB 3 and the Seg-PWB 4 are electrically connected to each other by using solder and the anisotropic conductive film.

Later, the Com-PWB 3 and the Seg-PWB 4 are electrically connected by fitting the male and female type connectors 81 and 82.

In this manner, the liquid crystal display panel 1, the TAB film 2, the Com-PWB 3, the Seg-PWB4 and the FPC 7 which are integrated as shown in FIG. 3 are set in the plastic chassis 53 and the lower bezel 52 which support the above constituent parts followed by covering the above constituent parts with the upper bezel 10 thereby completing the liquid crystal display apparatus.

According to the first embodiment, the connection terminal can be reduced in size by electrically connecting the Seg-PWB 4 and the Com-PWB 3 with the FPC 7. The liquid crystal display apparatus can be reduced in size by arranging the FPC 7 in the vicinity of the end part of the apparatus where the bent part 7a is formed, and the Seg-PWB 3 and the Com-PWB 4 are located in proximity to the liquid crystal display panel 1 to reduce an area of the window frame which is a part other than the display surface of the liquid crystal display apparatus.

Furthermore, according to the first embodiment, the terminal pitch of each of the connection terminals can be set to a small value on the order of 0.4 mm to 0.5 mm, and accordingly the width of the Com-PWB3 can be set to a small size on the order of 10 mm, by connecting the Seg-PWB 4 and FPC 7 with the anisotropic conductive film 9 and connecting the Com-PWB 3 and the FPC 7 with the male and female type connector 8 thereby making it possible to make an attempt to reduce the window frame of the liquid crystal display apparatus.

The separation of the main body of the FPC 7 from the soldered connection part and the resulting deterioration of the connection part as a result of repeated attaching and detaching operation of the connectors 81 and 82 can be prevented by the provision of a reinforcing plate 11 on a side opposite to the connector 82 of the FPC 7.

By the way, the reinforcing plate 11 may have a definite hardness and a definite size. The reinforcing plate 11 may have a size of covering the connector 82 or a size larger than the size of covering the connector 82. For example, the reinforcing plate 11 may be about 1 mm to 2 mm larger than the connector 82. As a material of the reinforcing plate 11, a general plastic material and a metal material can be used. In the first embodiment, specifically a plate is used which is formed of transparent acrylic resin and has a thickness of 0.5 mm.

Furthermore, the connection terminal 41 of the Seg-PWB 4 and the connection terminal of the FPC 7 can be easily and reliably connected by forming a single row of such connection terminals.

Furthermore, the window frame of the liquid crystal display apparatus can be further reduced in size by arranging the FPC 7 so that part of the FPC 7 overlaps the corner part of the liquid crystal display panel 1 so as to be separated from the attachment holding part 6 formed on the upper and the lower bezel and the plastic chassis. In the first embodiment, the window frame can be set to about 15 mm in a 10.4 type panel.

(Second Embodiment)

A second embodiment of the invention will be explained below referring to FIGS. 5 through 8.

The liquid crystal display apparatus according to the second embodiment of the invention is different from the liquid crystal display apparatus according to the first embodiment in the structure of the connection part for connecting the Seg-PWB 4 and the FPC 7. Since the second embodiment is the same as the first embodiment in other structures, an explanation on the same structural part will be omitted.

Figure 5:
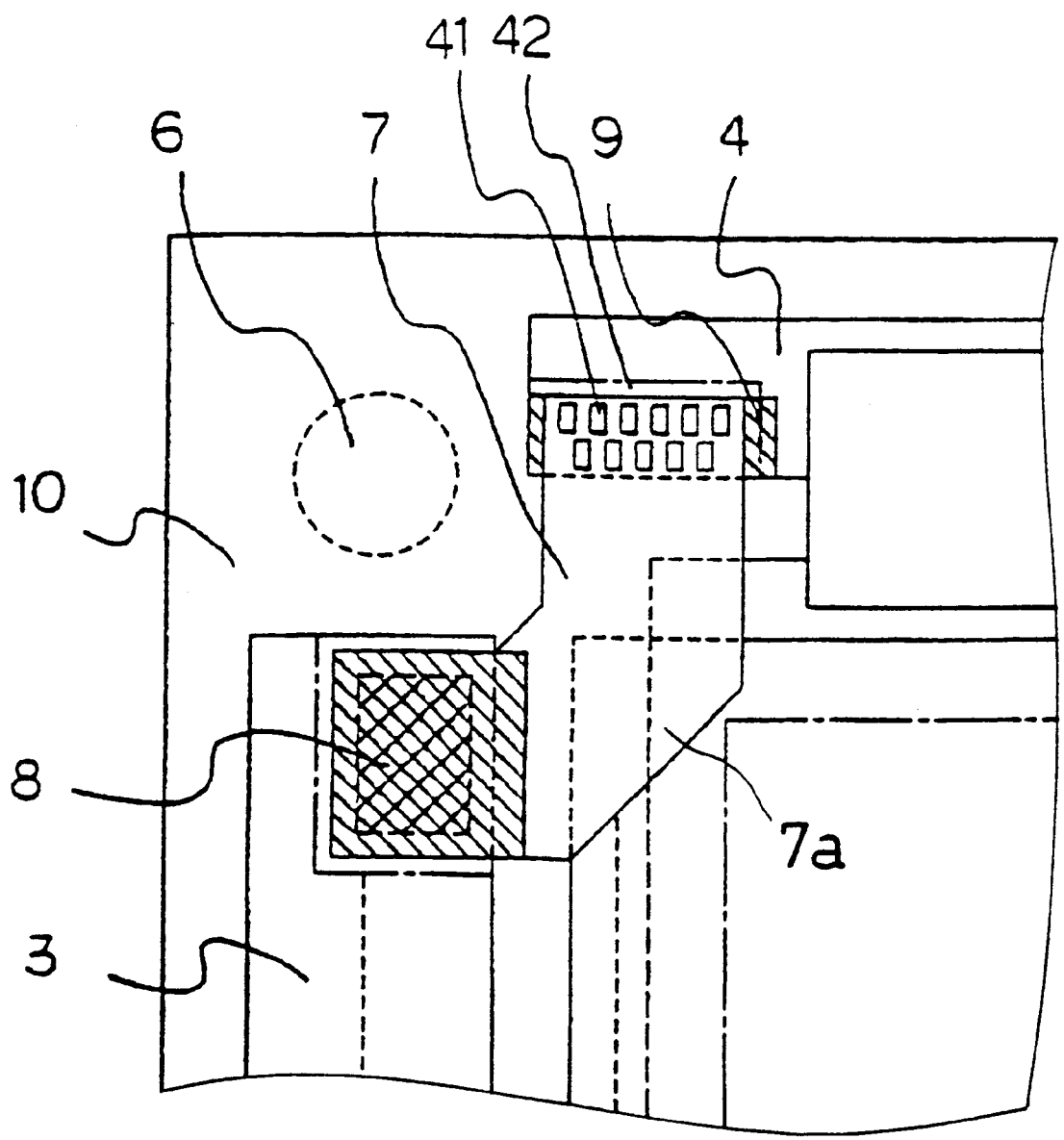
FIG. 5 is an enlarged plane view showing a portion of a liquid crystal display apparatus of the second embodiment of the invention.

In the second embodiment, the connection terminal 41 of the Seg-PWB 4 is formed in two rows as shown in FIG. 5. In such a structure of the second embodiment, the space for the connection terminal 42 is reduced as compared with a case in which only one row of such connection terminal 41 is formed. At the same time, the pitch of the connection terminal 41 can be set to a large value. Incidentally, the number of rows of the connection terminals is not limited to two, and three or more rows may be provided. However, two or three rows are preferable for a precise and secure connection of the connection terminals.

Figure 6A:
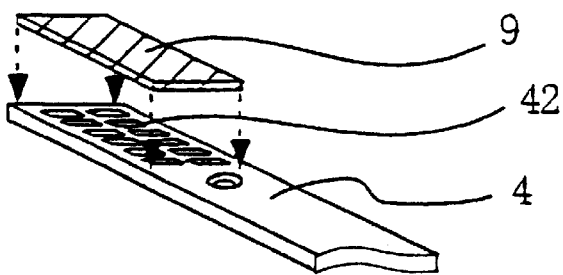
FIGS. 6A through 6D are perspective views showing stepwise a process connecting the Seg-PWB 4 and the flexible electrode substrate 7 using an apparatus for manufacturing the liquid crystal display apparatus of the invention.
Figure 6B:
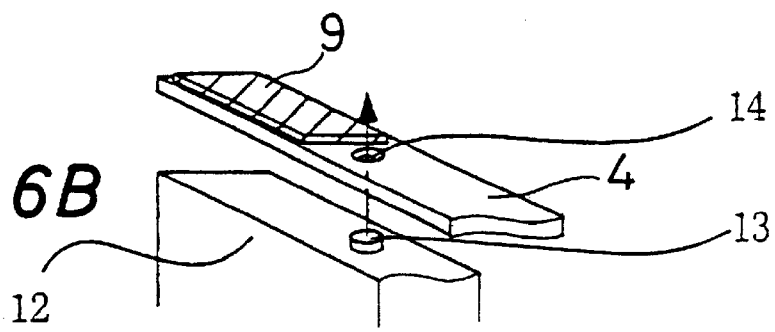
Figure 6C:
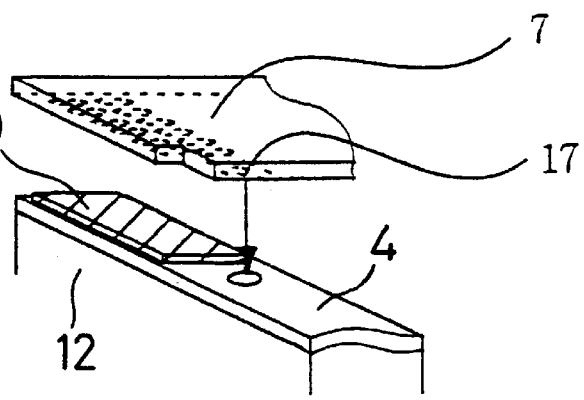
Figure 6D:
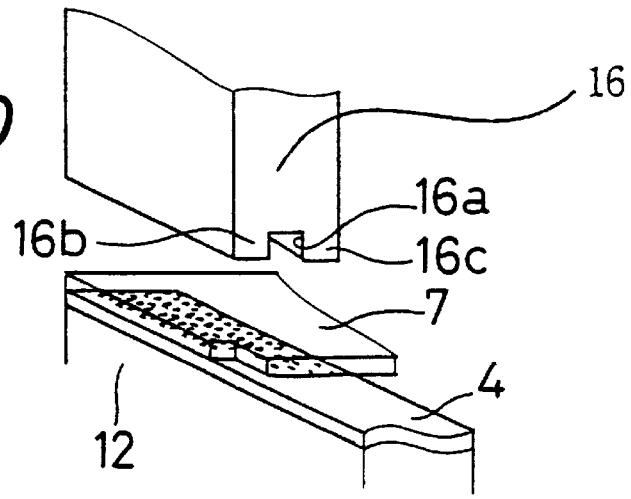
Figure 7:
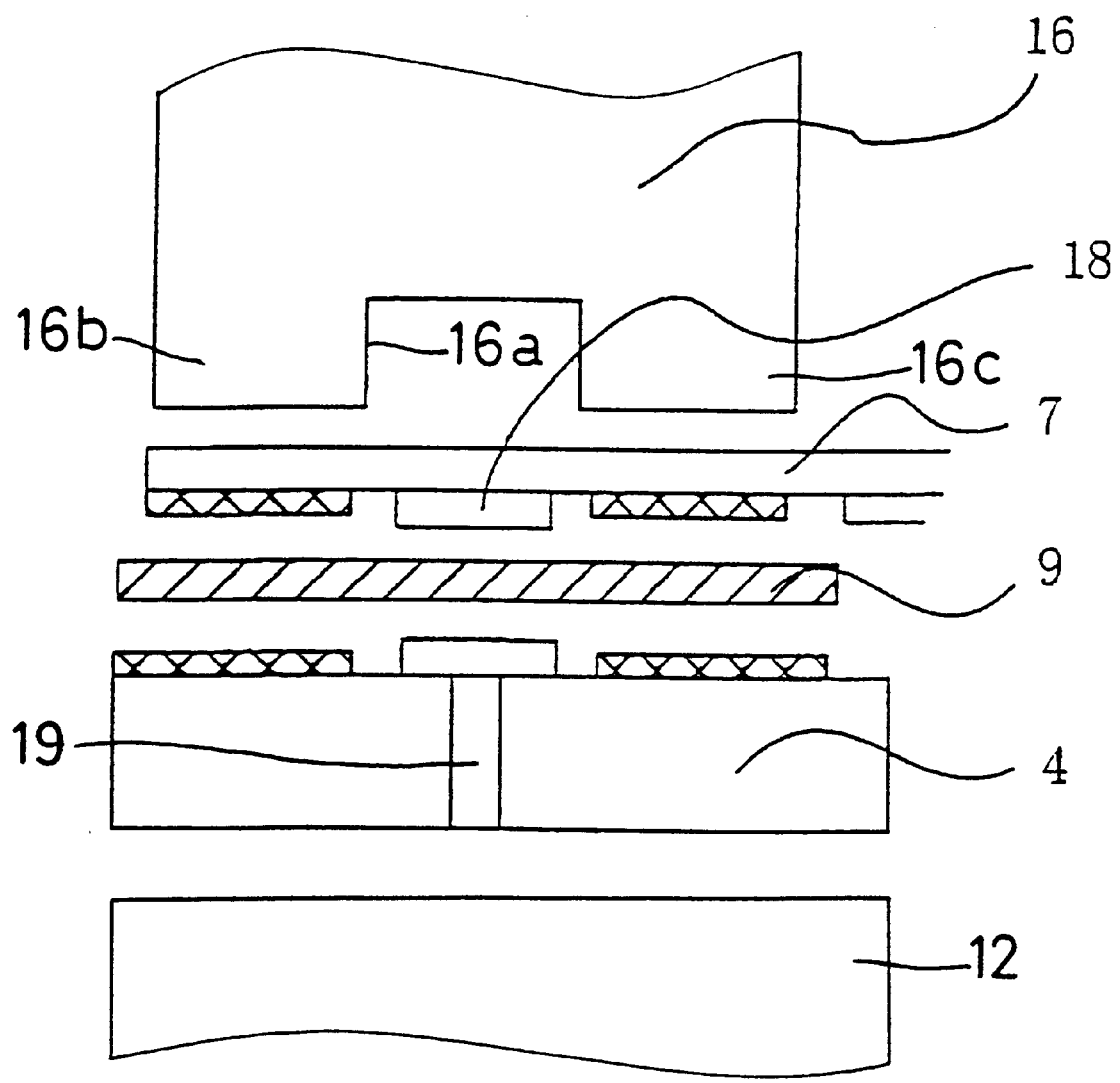
FIG. 7 is a side view showing a state of heat crimping of the second embodiment of the invention.

FIGS. 6A through 6D are perspective views showing stepwise a method for connecting the connection terminal 41 of the Seg-PWB 4 which terminal is formed in two rows to the FPC 7 by using the anisotropic conductive film 9 by means of an apparatus for manufacturing the liquid crystal display apparatus of the invention. FIG. 7 is a side view of a method shown in FIG. 6D. The apparatus for manufacturing the liquid crystal display apparatus of the invention heat crimps two circuit substrates having connection terminals formed thereon via the anisotropic conductive film with the connecting means comprising a crimping tool or the like. A schematic view of the apparatus is almost the same as the counterpart of the prior art. By the way, the apparatus for manufacturing the liquid crystal display apparatus of the invention is different from the conventional apparatus for the same purpose in that the apparatus of the invention is provided with a groove 16a at the end of the connecting means comprising the crimping tool 16 or the like as shown in FIG. 6D. A method for connecting the Seg-PWB 4 and the FPC 7 will be explained below referring to FIGS. 6A through 6D.

In the beginning, as shown in FIG. 6A, the anisotropic conductive film 9 is laminated onto the connection terminal 42 of the Seg-PWB 4. Next, as shown in FIG. 6B, the Seg-PWB 4 having the alignment hole 14 or the notch formed thereon is fit onto the alignment pin 13 formed on the alignment jig 12. Subsequently, as shown in FIG. 6C, the FPC 7 having an alignment mark 17 formed thereon is aligned to the Seg-PWB 4 and the Seg-PWB 4 with the FPC 7 is temporarily fixed with the anisotropic conductive film 9. Lastly, as shown in FIGS. 6D and 7, the Seg-PWB 4 and the FPC 7 are crimped and connected by using the crimping tool 16 with the Seg-PWB 4 and the FPC 7 being aligned. In the second embodiment, the contact heat method is used as a method for providing heat, but the second embodiment is not limited thereto. The pulse heat method may be used instead.

In the second embodiment, since one groove 16a is provided on the bottom part of the crimping tool 16, the two rows of terminals can be connected at the same time at an equal temperature and an equal pressure at the connection terminals with one and the other contact part 16b and 16c. In addition, as shown in FIG. 7, projections such as a resist 18 and a through-hole 19 or the like provided between rows of terminals can be evaded by the provision of the groove 16a with the result that the connection terminal 41 can be connected with reliability.

Furthermore, since the Seg-PWB 4 and the FPC 7 are aligned by using the alignment mark 17 in the second embodiment, a light-transmitting film is used as the FPC 7. Furthermore, to facilitate the alignment, terminals on both sides out of the Seg-PWB 4 terminals are formed with the width of the terminals being widened.

Figure 8:
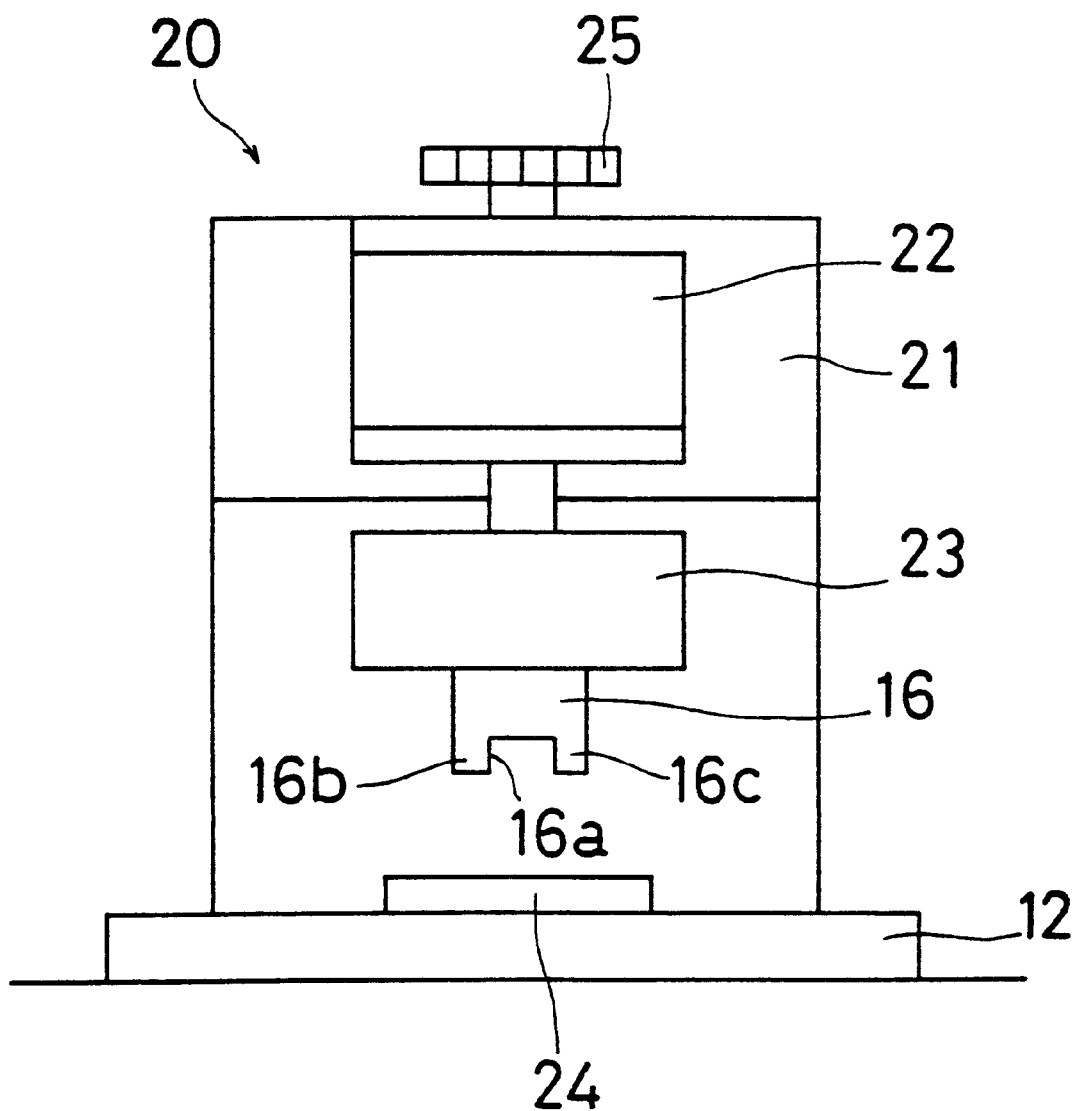
FIG. 8 is a side view of the apparatus for manufacturing the liquid crystal display apparatus.
Figure 9:
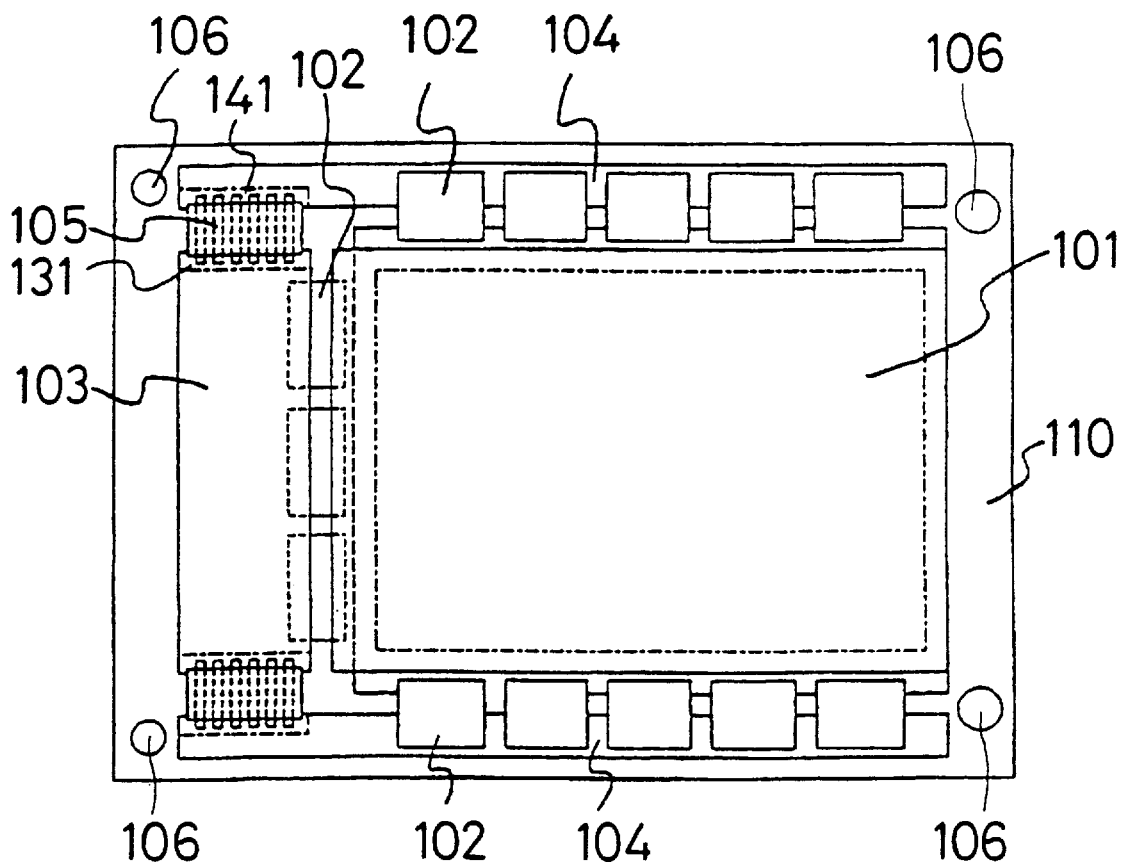
FIG. 9 is a plane view showing a structure of a general liquid crystal display apparatus of an prior art as seen form a side opposite to the display surface of the apparatus.

FIG. 8 is a side view showing a crimping device 20 having the jig 12 and the crimping tool 16. The crimping device 20 comprises a main body 21 of the crimping device, a cylinder 22, a heater 23, a crimping tool 16 which is a heating member, an applied pressure adjusting mechanism 25 and the jig 12.

The cylinder 22 is attached on the main body 21 of the crimping device and is constituted so as to be movable in a vertical direction. The heater 23 is provided below the cylinder 22, and is constituted to be movable in the vertical direction together with the cylinder 22. The crimping tool 16 is connected to a lower part of the heater 23. The pressure applied by the cylinder 22 is adjusted with the applied pressure adjusting mechanism 25. The substrate 24 to be processed is placed on the jig 12 which constitutes the base.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A liquid crystal display apparatus comprising:
constituent parts including;
a liquid crystal display panel;
a scanning side driving circuit substrate provided along a side of the liquid crystal display panel on a voltage application terminal side of a scanning electrode;
a data side driving circuit substrate provided along a side of the liquid crystal display panel on a voltage application terminal side of a data electrode; and
an upper and a lower bezel for supporting said constituent parts,
wherein the scanning side driving circuit substrate is electrically connected to the data side driving circuit substrate via a flexible electrode substrate which is arranged so that part of the flexible electrode substrate overlaps a corner part of the liquid crystal display panel.

2. A liquid crystal display apparatus comprising:
a liquid crystal display panel including a scanning electrode and a data electrode which are insulated from each other;
a scanning side driving circuit substrate having a length nearly equal to the length of one end of the liquid crystal display panel on a voltage application terminal side of the scanning electrode, and arranged approximately in parallel with the one end;
a data side driving circuit substrate having a length nearly equal to the length of another end of the liquid crystal display panel on a voltage application terminal side of the data electrode and arranged approximately in parallel with another end of the liquid crystal panel;

a flexible electrode substrate electrically connecting the scanning side driving circuit substrate to the data side driving circuit substrate, having a bent part which is located so that it overlaps a corner of the liquid crystal display panel and arranged near the end parts of the scanning side driving circuit substrate and the data side driving circuit substrate which are close to each other; and an upper and lower bezel supporting together the liquid crystal display panel, the scanning side driving circuit substrate, the data side driving circuit substrate and the flexible electrode substrate.

3. The liquid crystal display apparatus of claim 1 or 2, wherein the scanning side driving circuit substrate and the flexible electrode substrate are electrically connected to each other via a connector.

4. The liquid crystal display apparatus of claim 3, wherein a reinforcing member is provided on a side opposite to the connector of the flexible electrode substrate.

5. The liquid crystal display apparatus of claim 1 or 2, wherein the data side driving circuit substrate and the flexible electrode substrate are electrically connected to each other by using an anisotropic conductive film.

6. The liquid crystal display apparatus of claim 5, wherein the data side driving circuit substrate has connection terminals and the flexible electrode substrate has connection terminals, wherein the connection terminals are formed in a plurality of rows.

7. The liquid crystal display apparatus of claim 5, wherein the data side driving circuit substrate has connection terminals and the flexible electrode substrate has connection terminals wherein the connection terminals being formed in a single row.

8. The liquid crystal display apparatus of claim 1 or 2, wherein an attachment holding part for attaching the liquid crystal display apparatus is formed on each of the upper and the lower bezel in the vicinity of a position where the scanning side driving circuit substrate and the data side driving circuit substrate are located in proximity to each other.

* * * * *